US011923853B2

(12) United States Patent
Raja et al.

(10) Patent No.: US 11,923,853 B2
(45) Date of Patent: Mar. 5, 2024

(54) CIRCUIT STRUCTURES TO MEASURE FLIP-FLOP TIMING CHARACTERISTICS

(71) Applicant: NVIDIA Corp., Santa Clara, CA (US)

(72) Inventors: Tezaswi Raja, San Jose, CA (US); Prashant Singh, Santa Clara, CA (US)

(73) Assignee: NVIDIA CORP., Santa Clara, CA (US)

( * ) Notice: Subject to any disclaimer, the term of this patent is extended or adjusted under 35 U.S.C. 154(b) by 0 days.

(21) Appl. No.: 17/680,763

(22) Filed: Feb. 25, 2022

(65) Prior Publication Data

US 2023/0275572 A1 Aug. 31, 2023

(51) Int. Cl.
*H03K 3/037* (2006.01)
*H03K 3/03* (2006.01)
*H03K 5/01* (2006.01)
*H03K 5/00* (2006.01)

(52) U.S. Cl.
CPC ........... *H03K 3/037* (2013.01); *H03K 3/0315* (2013.01); *H03K 5/01* (2013.01); *H03K 2005/00078* (2013.01)

(58) Field of Classification Search
CPC ...................................................... H03K 3/037
USPC ............................................................ 331/57
See application file for complete search history.

(56) References Cited

U.S. PATENT DOCUMENTS

| | | | | |
|---|---|---|---|---|
| 6,075,418 A * | 6/2000 | Kingsley | .......... | G01R 31/31725 368/118 |
| 6,690,221 B1 | 2/2004 | Chang | | |
| 6,930,522 B2 | 8/2005 | Chang | | |
| 7,039,842 B1 * | 5/2006 | Whitten | ............. | G01R 31/3016 714/745 |
| 7,277,357 B1 | 10/2007 | Ma | | |
| 7,370,245 B1 * | 5/2008 | Verma | .................. | H03K 3/0315 714/700 |
| 8,037,382 B2 | 10/2011 | Gunasekar | | |
| 8,224,604 B1 | 7/2012 | Amrutur et al. | | |
| 9,147,620 B2 | 9/2015 | Wagt et al. | | |
| 9,804,225 B2 | 10/2017 | Singh et al. | | |
| 10,386,412 B2 | 8/2019 | Singh et al. | | |
| 10,586,585 B2 | 3/2020 | Gopalan et al. | | |
| 11,139,802 B1 * | 10/2021 | Marfatia | .............. | H03K 3/0315 |
| 2007/0089076 A1 | 4/2007 | Amatangelo | | |

* cited by examiner

*Primary Examiner* — Joseph Chang
(74) *Attorney, Agent, or Firm* — Rowan TELS LLC

(57) ABSTRACT

A ring oscillator circuit with a frequency that is sensitive to the timing of a clock-to-Q (clk2Q) propagation delay of one or more flip-flops utilized in the ring oscillator. The clock2Q is the delay between the clock signal arriving at the clock pin on the flop and the Q output reflecting the state of the input data signal to the flop. Clk2q delay measurements are made based on measurement of the ring oscillator frequency, leading to more accurate estimates of clk2Q for different types of flip-flops and flip-flop combinations, which may in turn enable improvements in circuit layouts, performance, and area.

16 Claims, 13 Drawing Sheets

US 11,923,853 B2

CIRCUIT STRUCTURES TO MEASURE FLIP-FLOP TIMING CHARACTERISTICS

BACKGROUND

Flip-flops are circuit devices that are commonly utilized in synchronous systems. A typical flip-flop propagates its current input to its output at the transition of a clock signal (known as clocking, pulsing, or strobing the flip-flop). Clocking causes the flip-flop either to change or to retain its output signal based upon the value(s) of the input signal(s) at the transition. Some flip-flops change output on the rising edge of the clock, others on the falling edge.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Disclosed herein are embodiments of a ring oscillator circuit with a frequency that is sensitive to the timing of a clock-to-Q (clk2Q) propagation delay of one or more flip-flops utilized in the ring oscillator. Clock2Q is the delay between the clock signal arriving at the clock pin on the flop and the Q output reflecting/responding to the clock signal by toggling or not, e.g., the Q output reflecting the state of the input data signal to the flop. The disclosed circuits enable clk2q delay measurements based on measurement of the ring oscillator frequency. This may lead to more accurate estimates of clk2Q for different types of flip-flops and flip-flop combinations, which may in turn enable improvements in circuit layouts, performance, and area. Lack of adequate precision in the estimate of clk2Q may lead to malfunctions in circuits utilizing the flip-flop or ones like it.

The following examples are depicted utilizing D-type flip-flops. However the circuits and methodologies disclosed may be utilized more generally with any type of clocked flip-flop in manners that will be readily understood by those of skill in the art in view of this disclosure.

The depicted ring oscillator embodiments may utilize homogeneous or heterogeneous flip-flop types in a single ring. Measurement of clk2q may be made independently on any flip-flop type in the ring. This is an average clk2Q measurement across all the flip-flops of the same type in the ring. At a given time, one flip-flop type may be excited for measurement. A control circuit and selector (e.g., a multiplexer) may be utilized to select the flip-flop type to characterize. Additional circuitry injects the opposite edge of a particular Q signal from a particular flip-flop into another stage in the ring. For example, to maximize the timing margin, the opposite edge signal may be injected at a diametric stage (180 degrees around the ring, or closest to 180 degrees around if there are an odd number of flops in ring).

Figure 1:
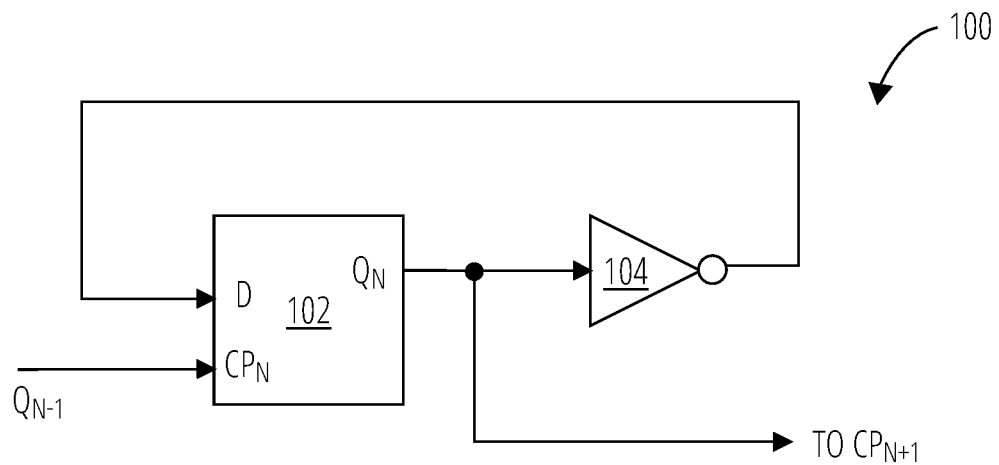
FIG. 1 depicts a ring oscillator stage 100 in accordance with one embodiment.

The ring oscillator stage 100 depicted in FIG. 1 comprises a flip-flop 102 and an inverter 104. FIG. 1 is an example of a stage of the ring oscillator depicted in FIG. 2A.

Upon receiving a clock signal (e.g., rising edge) at CP, the output terminal Q reflects the signal value at the D input terminal. The delay between receipt of the clock signal at CP and Q reflecting the signal at D is "clk2Q". The time needed for a signal to arrive and settle at D before it can be reflected to Q by the clock signal is called "d2clk".

The Q output of the previous stage (N−1) is used to clock the flip flop at stage N. Likewise the output Q of the current stage becomes the clock for the next stage N+1. The inverter 104 feeds back the complement of Q to D for the stage, thus ensuring that Q will flip values on the next clock.

Figure 2A:
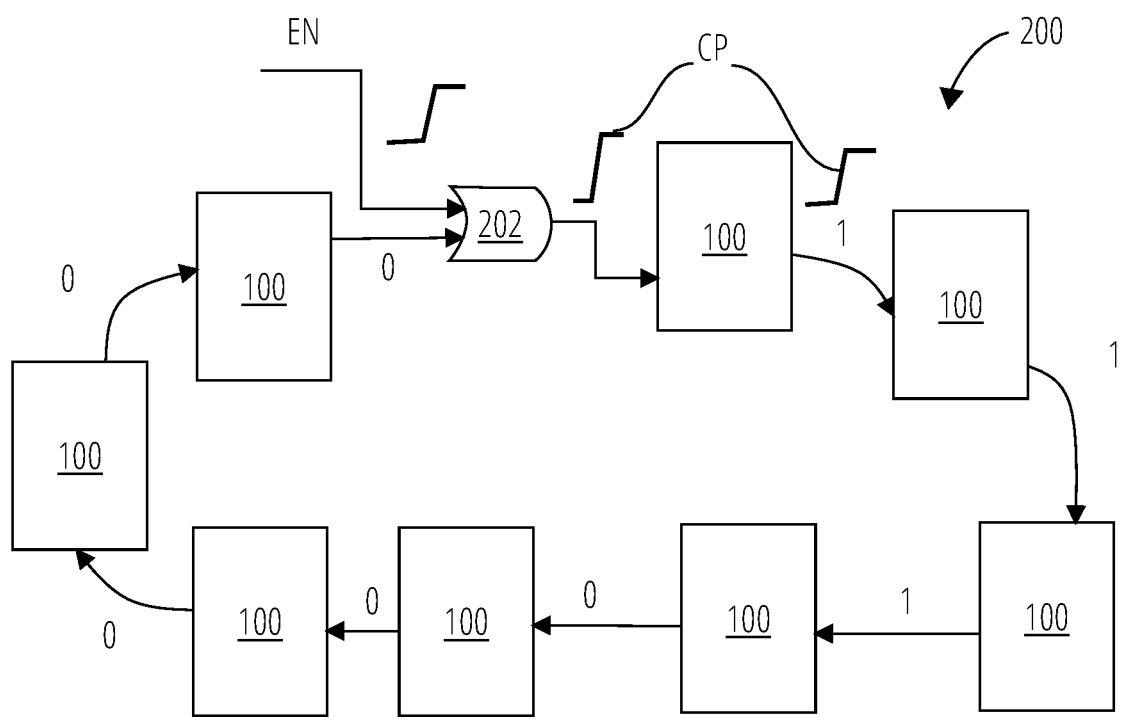
FIG. 2A depicts excitation of a ring oscillator 200 with a 0-1 signal transition, in accordance with one embodiment.
Figure 2B:
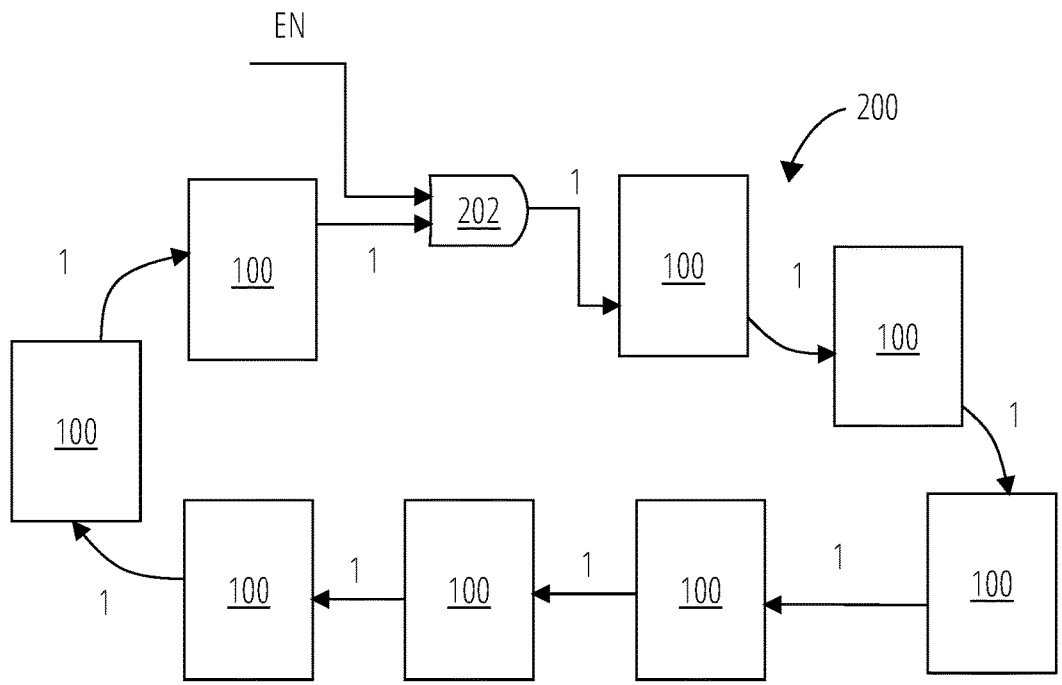
FIG. 2B depicts propagation of the 0-1 transition through the ring oscillator 200, in accordance with one embodiment.

The ring oscillator embodiment depicted in FIG. 2A is a ring oscillator 200 circuit to measure clock2Q. An enable signal is provided at an OR gate 202 to initiate propagation of a clock signal (CP) through the various ring oscillator stages 100. Many such ring oscillators 200 may be disposed at many locations on a larger circuit die. One challenge to use of such a ring oscillator 200 is that the clk2q "arc" (path through the ring) is driven by rising edges of the clock signal. Unlike a regular combinational ring oscillator, the falling edge on the CP (clock) terminal won't propagate any further and the ring oscillator 200 won't oscillate once the rising edge propagates all the way through once (FIG. 2B).

Figure 2C:
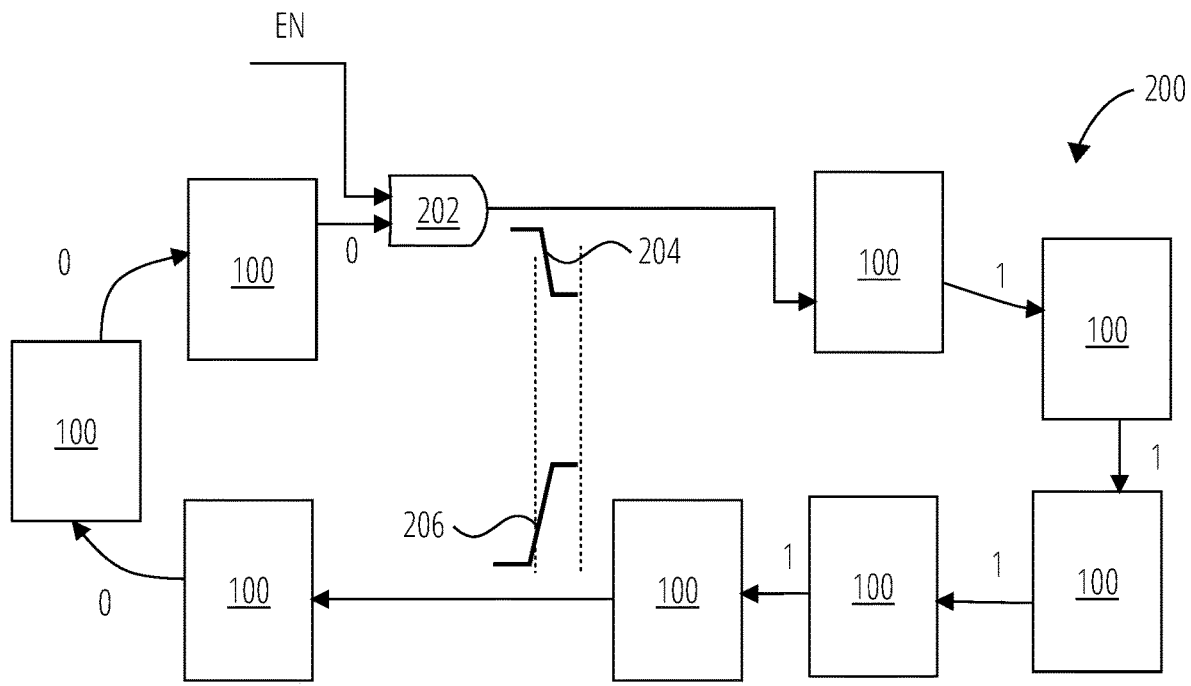
FIG. 2C depicts injection of a 1-0 transition in a stage of the ring oscillator 200, in accordance with one embodiment.
Figure 2D:
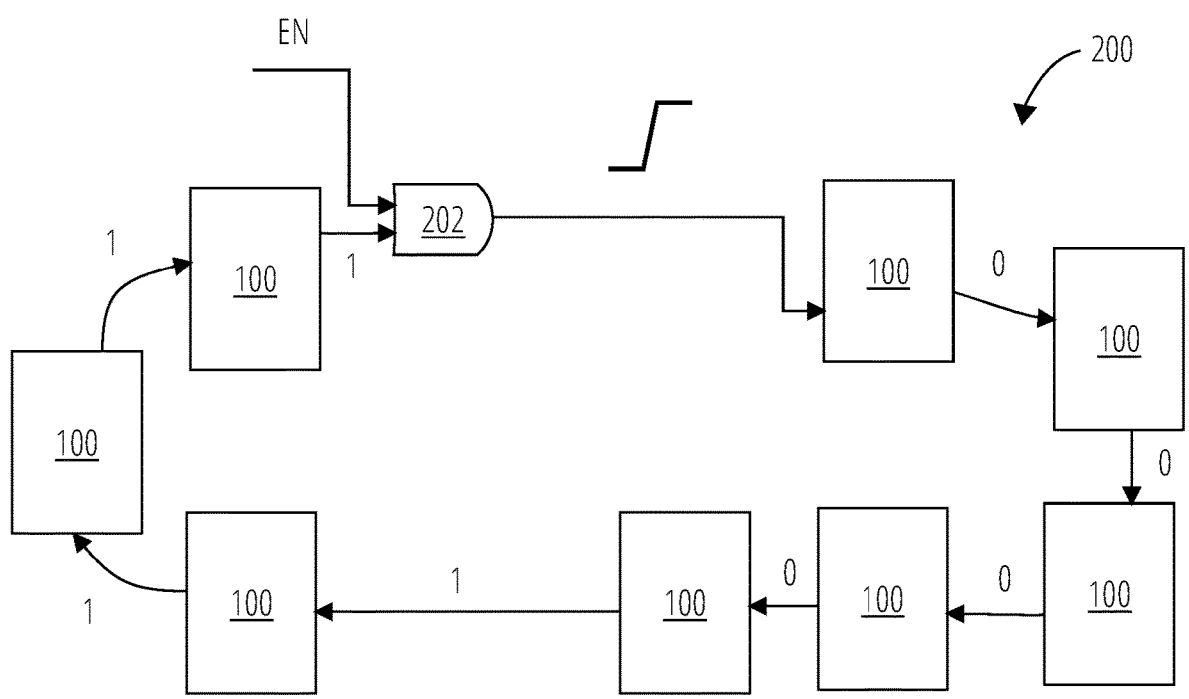
FIG. 2D depicts the ring oscillator 200 in a sustained oscillation mode, in accordance with one embodiment.

To address this shortcoming, a falling CP edge 204 transition may be injected into a particular stage of the ring oscillator when a rising CP edge 206 reaches a particular ring stage (FIG. 2C) (or vice versa, a rising edge may be injected on occurrence of a falling edge at a particular stage). The rising CP edge 206 continues to propagate along with the falling CP edge 204 as depicted in FIG. 2D, and consequently the ring oscillator 200 sustains oscillations. In one embodiment, a diametrically opposite, or nearest to diametrically opposite edge of CP is inverted between stages. More generally, the inversion could occur at any stage of the ring oscillator 200.

Figure 3A:
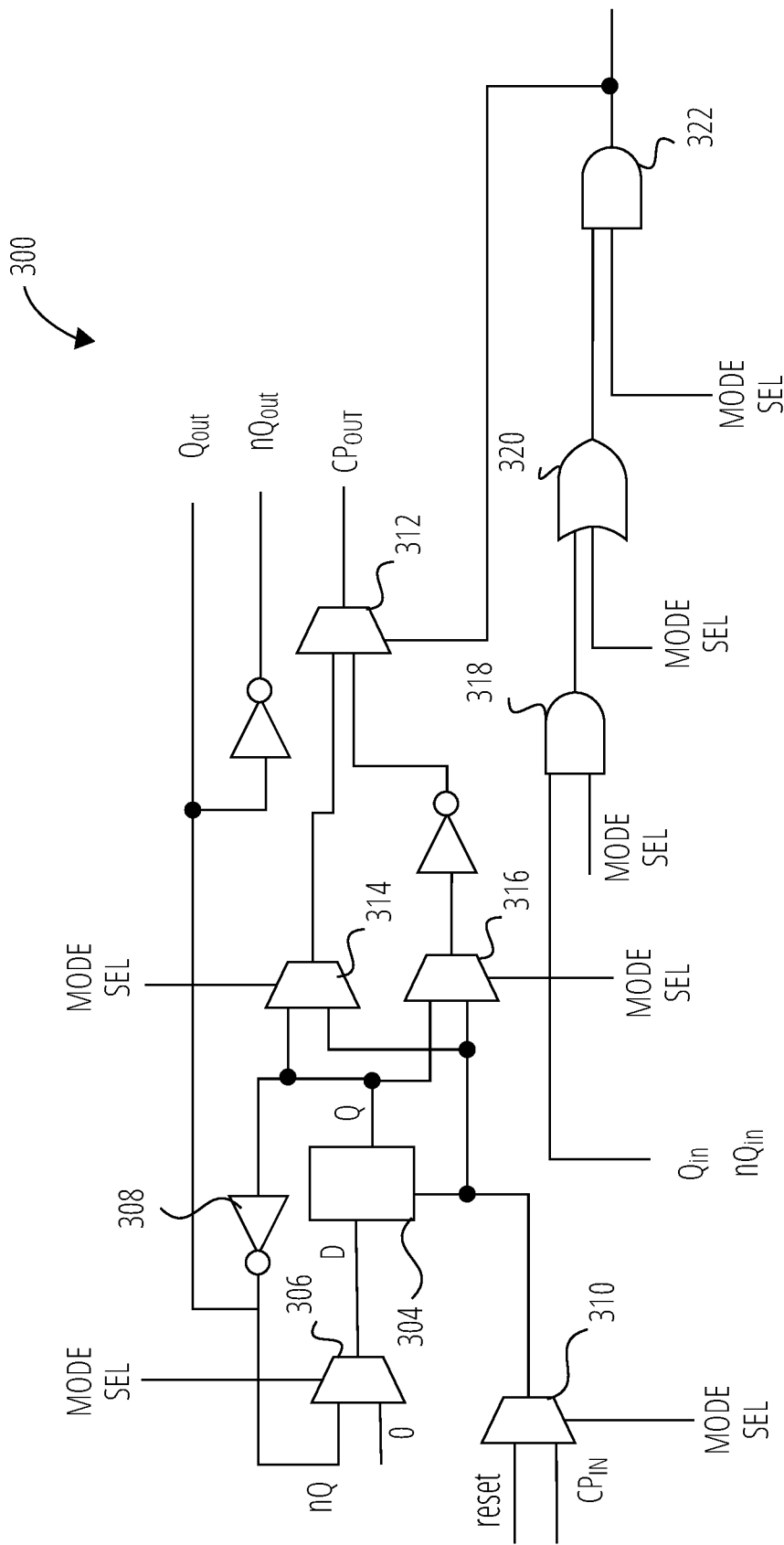
FIG. 3A depicts a control circuit 300 for a flip flop ring oscillator stage in one embodiment.
Figure 3B:
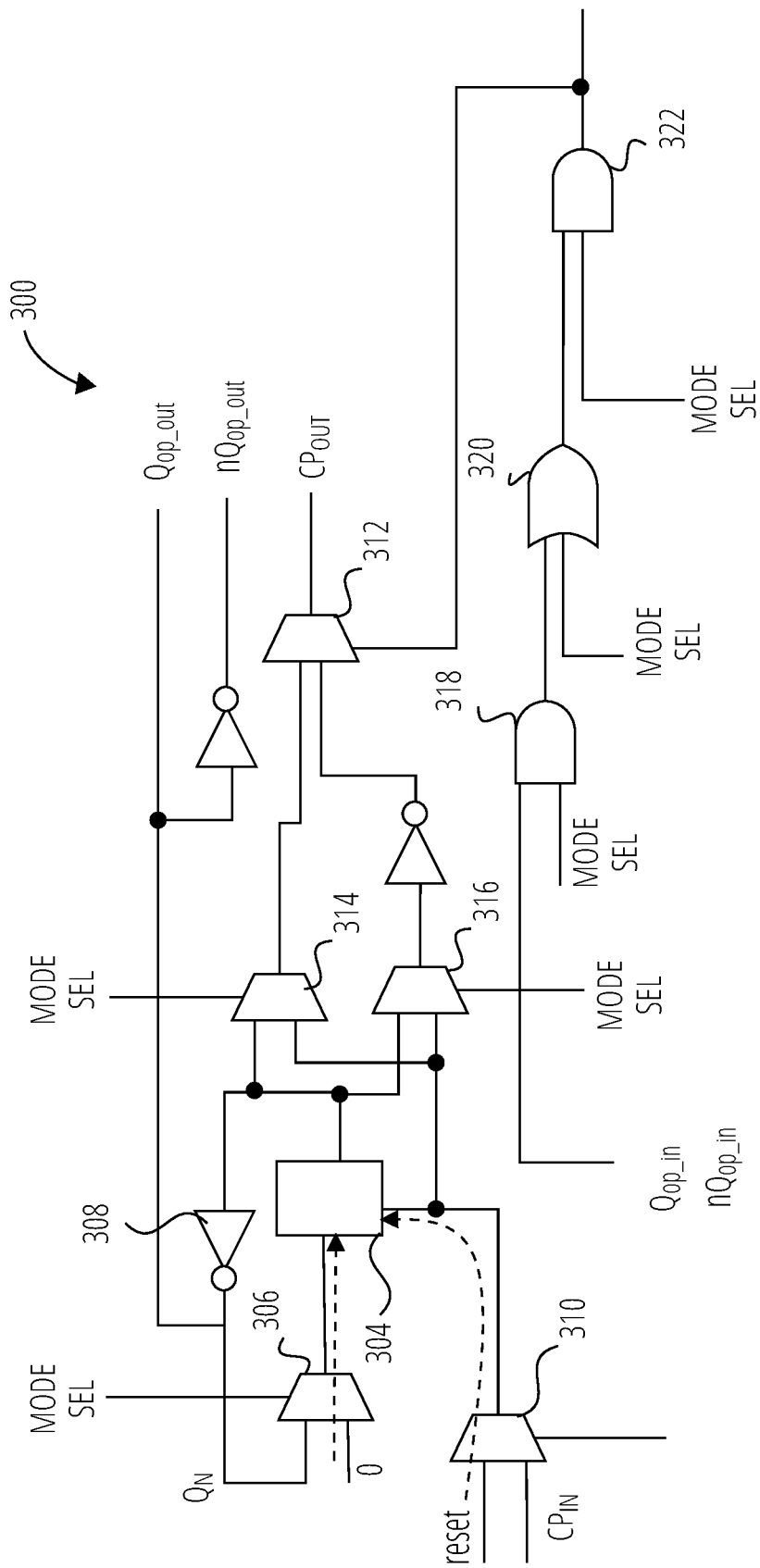
FIG. 3B depicts the control circuit 300 in reset mode.

FIG. 3A depicts a control circuit 300 for a flip flop ring oscillator stage in one embodiment. The control circuit 300 enables a flip flop (or bank of flip flops) to operate in different modes in a ring oscillator via a mode control signal (MODE SEL). In one embodiment the control circuit 300 may operate in three distinct modes: the clk2Q measurement mode, and two distinct calibration modes. A mode comprises a distinct signal propagation path through the control circuit 300. The different modes are depicted in FIG. 3B-FIG. 3E.

The control circuit 300 includes a clock signal input CPin and a clock signal output Cpout. These signals come from and go to the previous and next ring oscillator stages, respectively. The Q (or its complement, nQ) signal from the flip flop in a different (e.g., 180° opposite) stage is also input and applied generate an opposite (e.g., falling if the input value is rising) transition at CPout. Another input, RESET, is used to initialize the flip flop 304 of the stage. The RESET is applied to all the stages in the ring at initialization, clocking the "0" value at the D inputs of the flip flops to set Q of each flip flop to "0".

The flip flop 304 clocks a signal D to its output Q. The signal to D is provided from the multiplexer 306, and is either an initialization signal (e.g., "0") or the inverted version (nQ) of the previous Q output, provided via the inverter 308. A control circuit 300 may be provided at each stage of the ring oscillator 200, or a bank of two or more flip flops in the ring oscillator 200 may share common aspects of the control circuit 300. To adapt the control circuit 300 for use in a flip flop bank, the circuits providing D input and the reset signals may be fanned out to each flip flop in the bank, and a multiplexer may be added to receive the Q outputs of the flip flops and to select one Q output to apply to downstream elements of the control circuit 300.

A reset signal is selected by the multiplexer 310 to clock the flip flop 304 at initialization. Once initialized and in an operating mode (clk2Q or calibration modes), the multiplexer 310 selects the CPin signal to clock the flip flop 304. The CPin signal is the CPout signal from the multiplexer 312 of a preceding stage.

In one example of initialization (see FIG. 3B), the mode is set to "reset", selecting the reset signal at multiplexer 310 and the "0" input at multiplexer 306. The "0" is clocked to Q by the flip flop 304 for all stages of the ring oscillator, inverted by the inverter 308 and applied as nQ="1" at the multiplexer 306, awaiting the next clock signal. The mode is switched to one of the operating modes, so that the multiplexer 310 selects CPin as the clock and the multiplexer 306 selects nQ="1" as the D input to the flip flop 304. The flip flop 304 clocks the "1" to Q, and this is inverted by the inverter 308 for the next clock, and so on.

In clk2Q modes, the multiplexer 314 and multiplexer 316 may select either Q or nQ to propagate to multiplexer 312. The multiplexer 312 selects one of these to CPout, the clock for the next stage in the ring oscillator. The selection signal for the multiplexer 312 is generated, from the operating mode and from the output of a different stage, e.g., a stage at or close to 180 degrees away from the stage around the ring, by the AOA cell formed by AND gate 318, OR gate 320, and AND gate 322. In calibration modes, the multiplexer 314 and multiplexer 316 may switch either CPin or the inverse of CPin signal to multiplexer 312, as depicted in FIG. 3D and FIG. 3E. For setup and hold time estimation, the CPin signal may be directed through configurable delay elements 324, which is described further in conjunction with FIG. 4 and FIG. 6A-FIG. 6C.

Figure 3C:
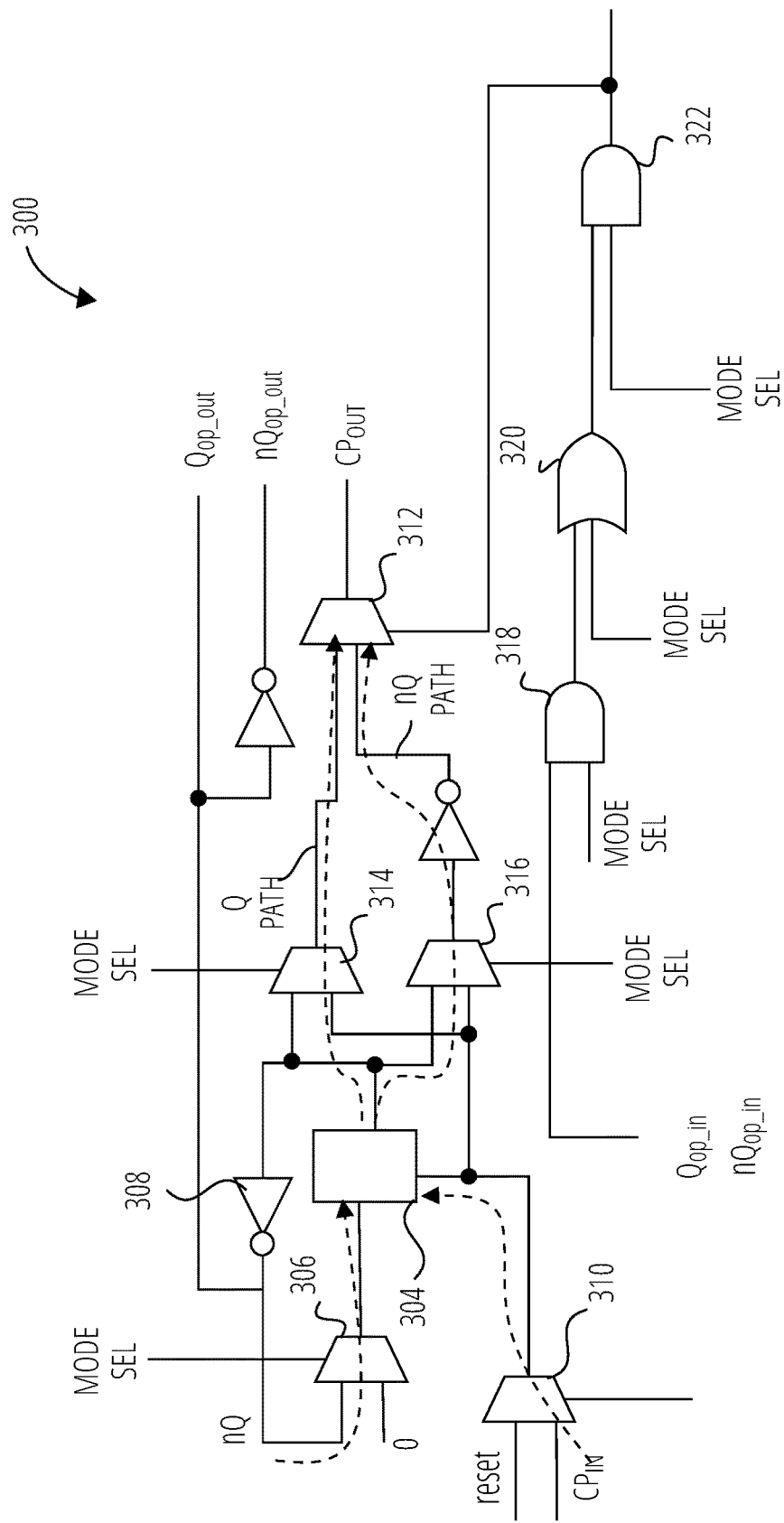
FIG. 3C depicts signal propagation through the control circuit 300 in clk2Q mode.
Figure 3D:
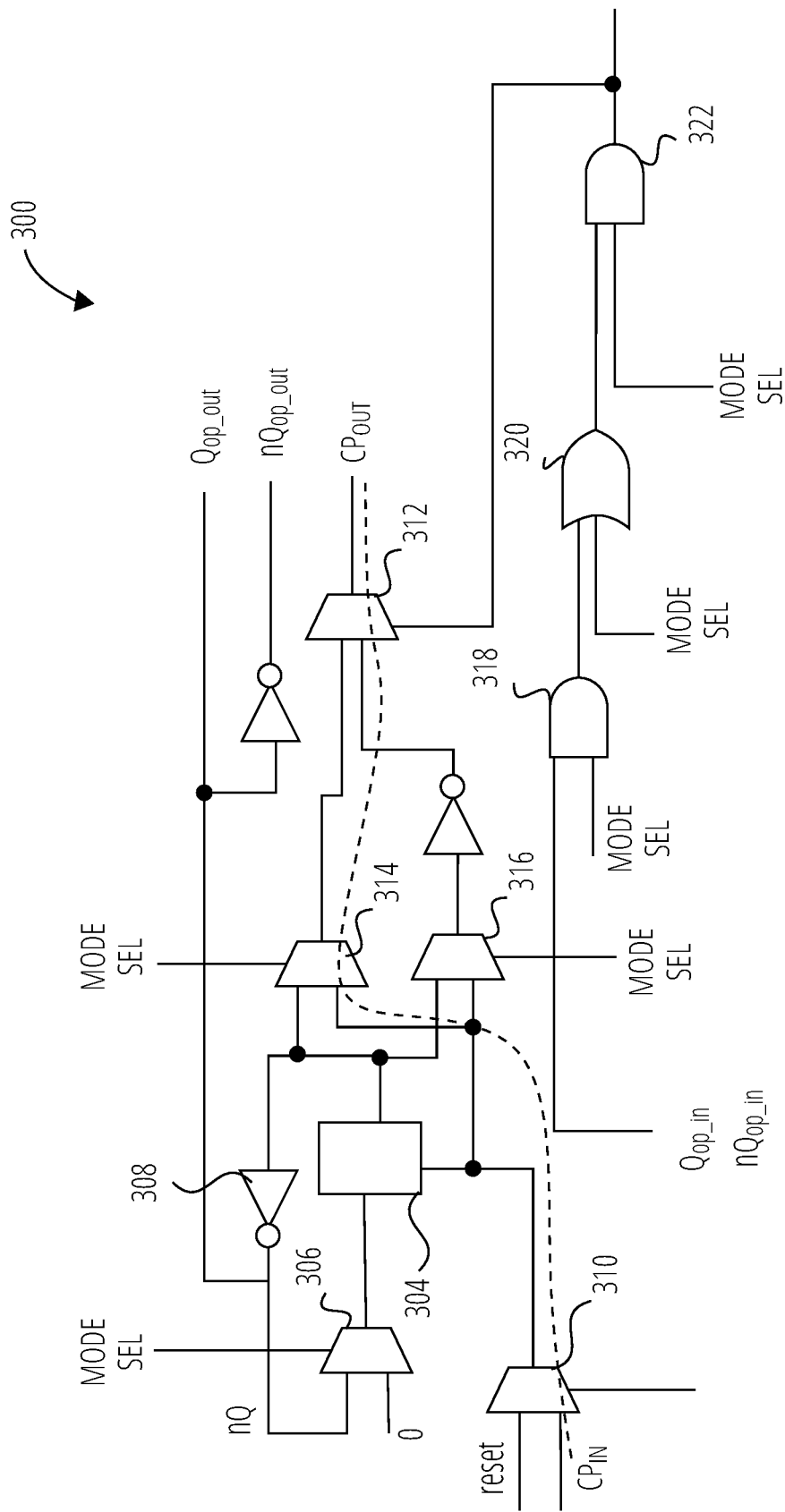
FIG. 3D depicts signal propagation through the control circuit 300 in a first calibration mode (non-flop Q path mode).
Figure 3E:
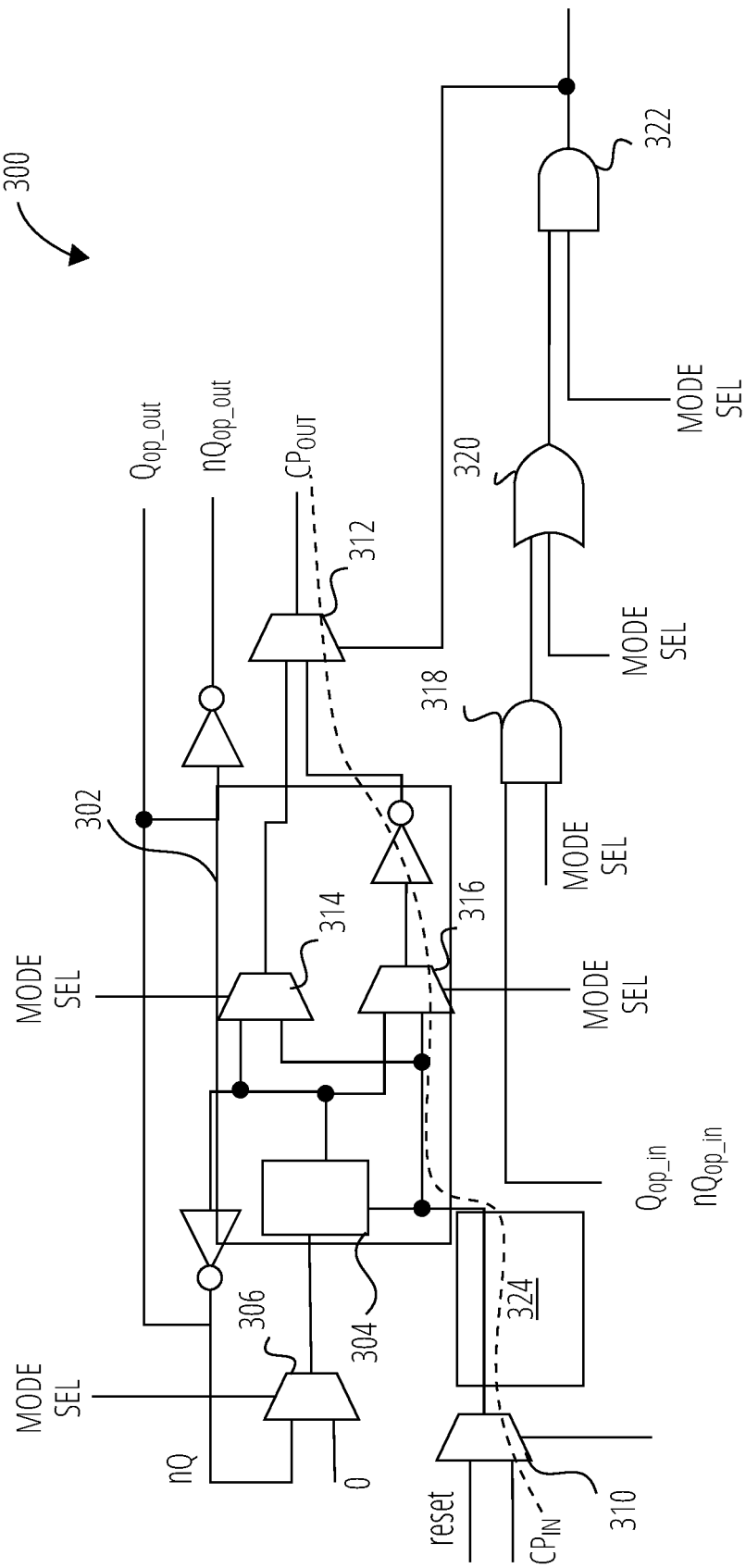
FIG. 3E depicts signal propagation through the control circuit 300 in a second calibration mode (non-flop nQ path mode).

FIG. 3C depicts the paths excited in the control circuit 300 in clk2Q mode (in which the clk2Q propagation path of the flip-flop is excited). The Q (and Qn) path is excited in the first (and second) phase of oscillation, respectively.

FIG. 3D and FIG. 3E depict the propagation paths exited in the control circuit 300 in calibration modes. FIG. 3D depicts the excited path when calibrating the Q path and bypassing the flip flop 304; FIG. 3E depicts the excited path when calibrating the nQ path and bypassing the flip flop 304.

In one embodiment the following algorithm is utilized to compute clk2Q from the ring oscillator frequency behavior:

$$(\text{Clk2}Q_{rise} + \text{Clk2}Q_{fall}) = \text{OscPeriod}(\text{Clk2}Q) - 0.5(\text{OscPeriod}(\text{Cal}Q) + \text{OscPeriod}(\text{Cal}\overline{Q}))$$ Equation 1

Cal$\overline{Q}$ $\overline{Q}$

Figure 4:
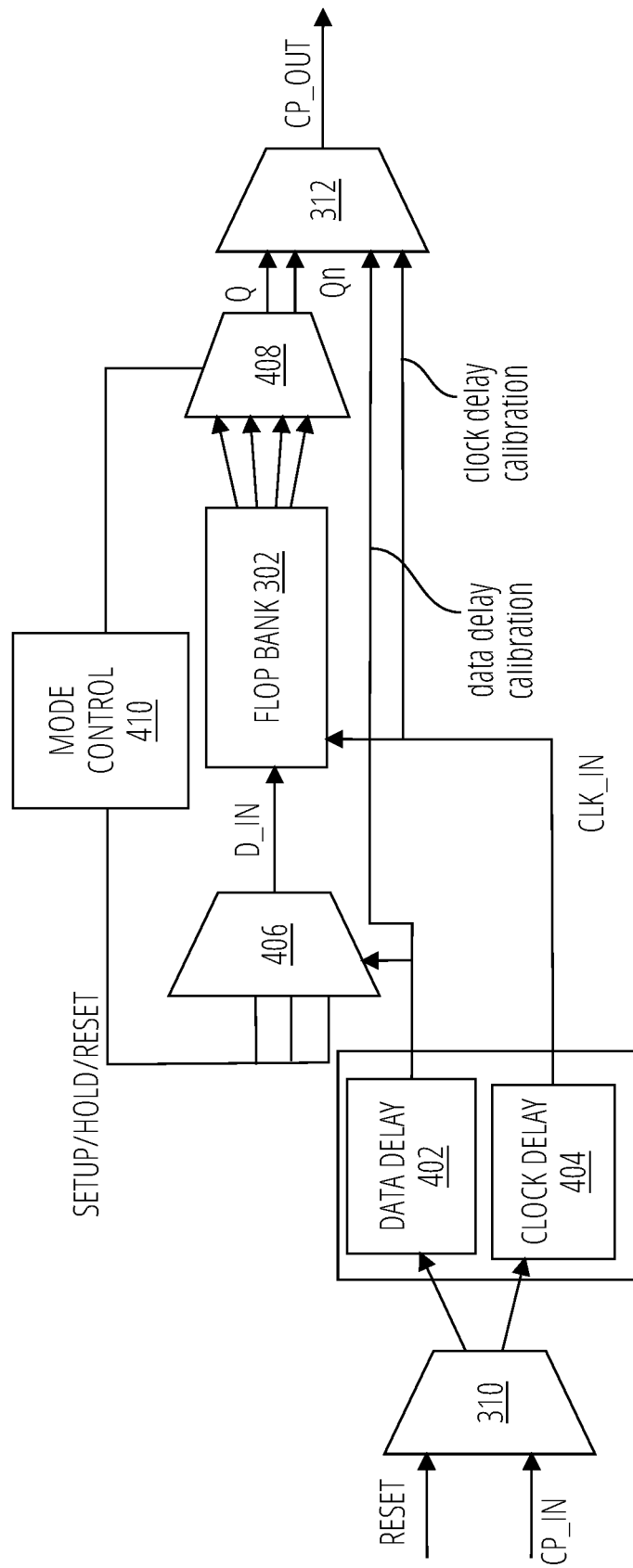
FIG. 4 depicts sharing of some circuitry of the control circuit 300 among multiple flip-flops (flop bank 302) in accordance with one embodiment.

FIG. 4 depicts sharing of some circuitry of the control circuit 300 among multiple flip-flops (flop bank 302) in accordance with one embodiment. The multiplexer 406 and multiplexer 408 are utilized to select inputs and outputs of the flop bank 302, respectively. (The multiplexer 408 may in fact embody additional elements of the distinct Q and nQ paths depicted in FIG. 3A-FIG. 3E). The delay elements 324 comprises components configuring the data delay 402 and the clock delay 404 settings. For example, the data delay 402 component may comprise 63 delay elements, enabling configuration of a 1 ps delay delta between each setting of the data delay 402. The clock delay 404 component may comprise two settings, one for set-up measurement, and the other for hold measurement.

Figure 5:
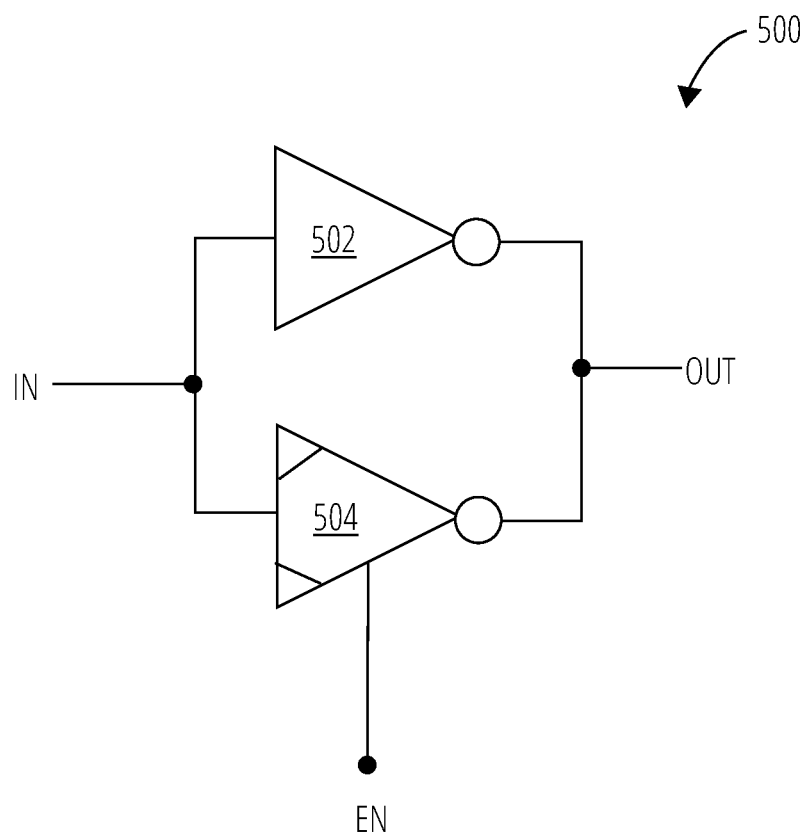
FIG. 5 depicts a delay element 500 in accordance with one embodiment.

FIG. 5 depicts an exemplary unit delay element 500 of the data delay 402 and clock delay 404 components. The delay element 500 comprises an inverter 502 and a tri-state inverter 504 configured in parallel. When the tri-state inverter 504 is enabled the propagation delay of the delay element 500 drops by a factor D, e.g. by 1 ps. To implement the data delay 402, a number N (e.g., 63) of such delay elements 500 are configured in series with a separate EN for each delay element 500. This provides up to N*D configurability of the propagation delay introduced by the data delay 402 component. The clock delay 404 component is configured in the same manner (e.g., N delay elements 500 in series) except that all the units share the same EN which enables two delay settings only (one for set-up and other for hold) with N*D propagation delay difference between them.

Figure 6A:
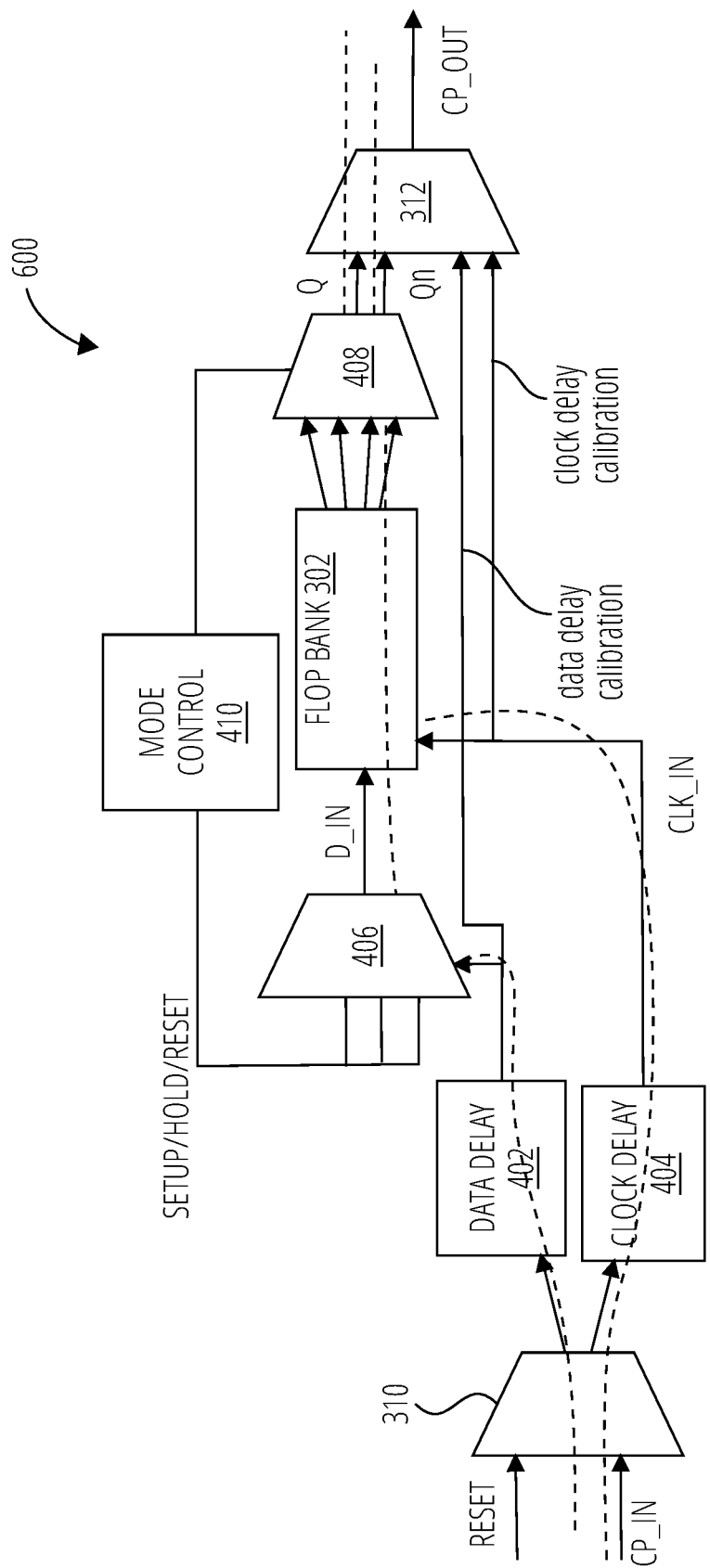
FIG. 6A depicts clk2Q signal propagation through a control circuit 600 for setup/hold time measurement.

FIG. 6A depicts clk2Q signal propagation through a control circuit 600 for setup/hold time measurement. The Q (and Qn) paths are excited in the first and second phase of the ring oscillation, respectively. The CPin and D inputs to the flop bank 302 are delayed through the data delay 402 and clock delay 404 components, respectively. For setup and hold time measurement, the clk2Q mode is excited across multiple settings of the data delay 402. The CPin signal is split such that it is used to independently vary both of the clock to the flop bank 302 and the data to the flop bank 302. By varying these delay settings, a value of data delay 402 that produces (for example) a 10% increase in the clk2Q value may be determined.

Figure 6B:
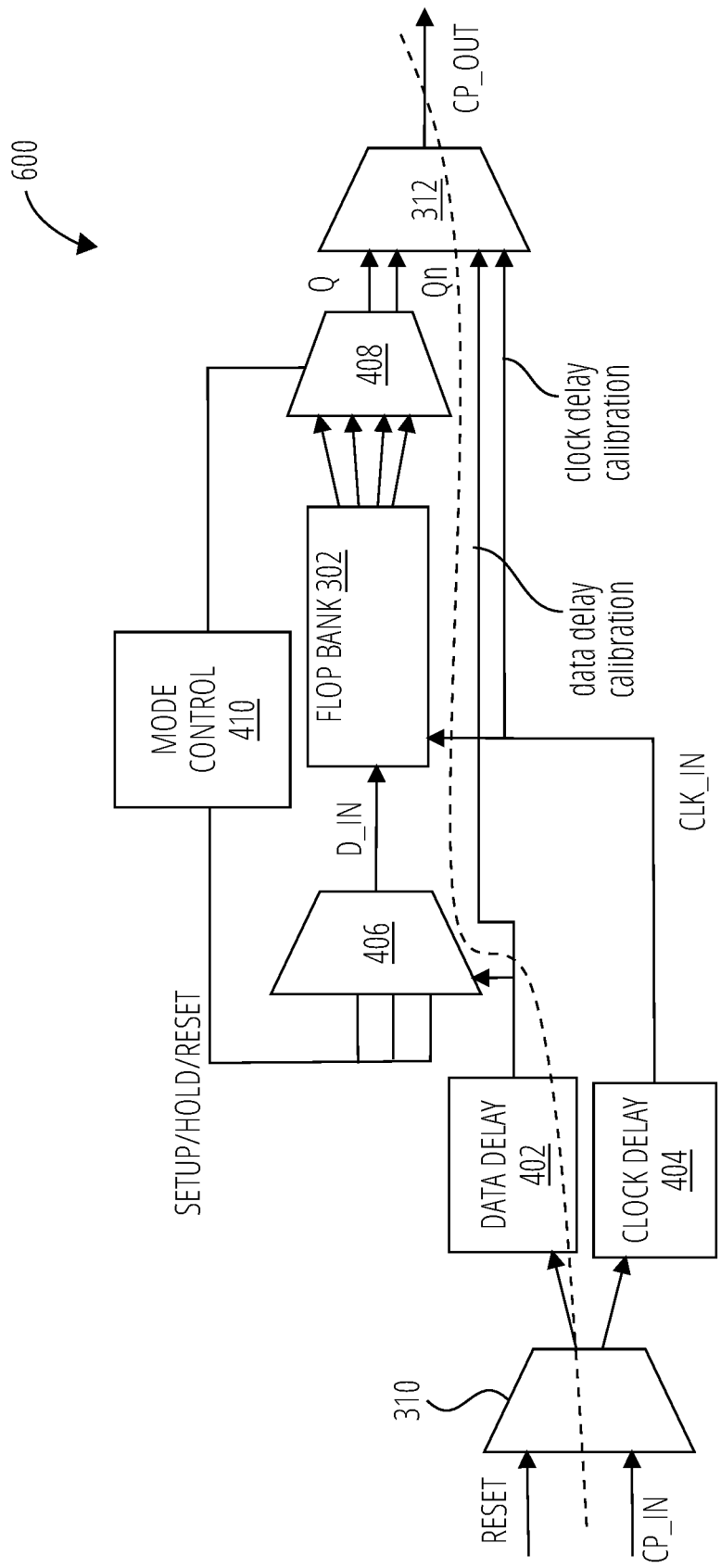
FIG. 6B depicts signal propagation for data delay calibration through the control circuit 600.
Figure 6C:
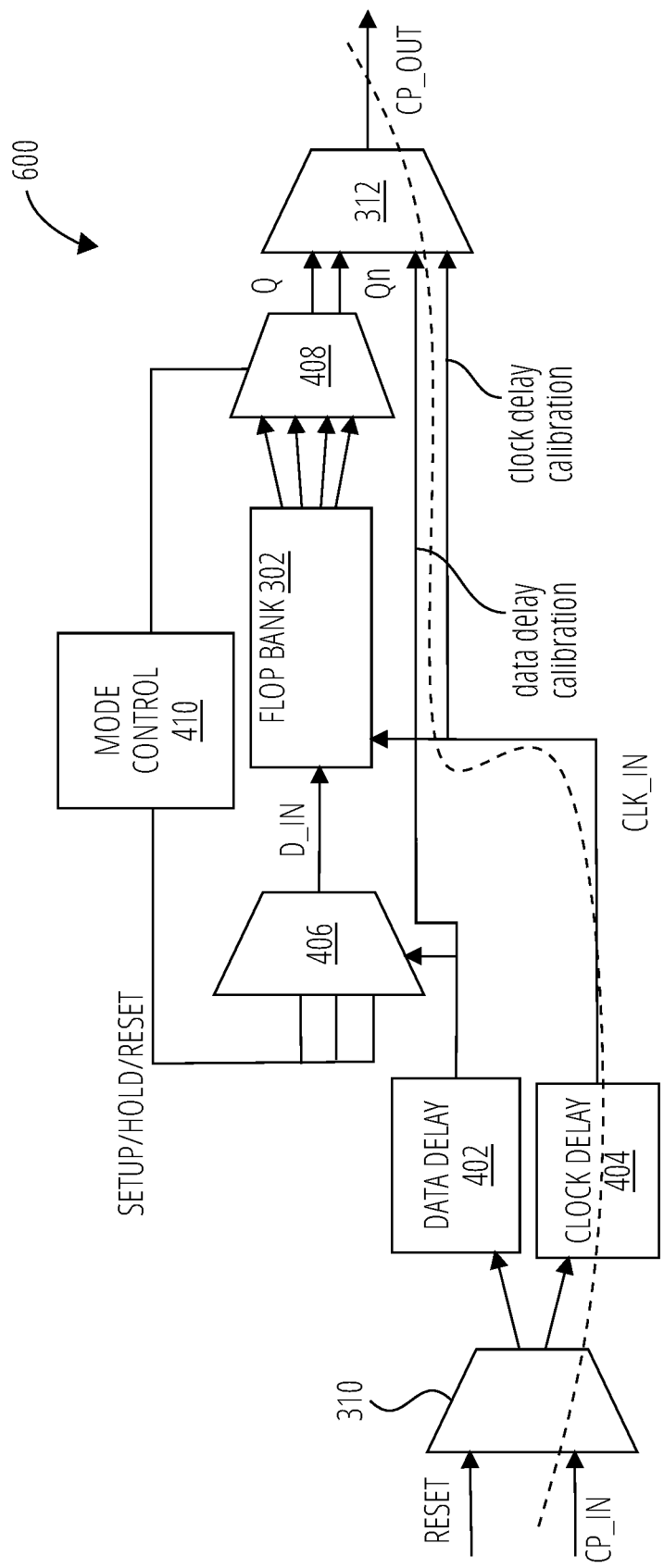
FIG. 6C depicts signal propagation for clock delay calibration through the control circuit 600.

FIG. 6B depicts signal propagation for data delay calibration through the control circuit 600 and FIG. 6C depicts signal propagation for clock delay calibration through the control circuit 600. These modes enable determination of the value of the d2clk delay that corresponds to the (e.g., 10%) threshold increase in clk2Q. The delay of the signal propagation depicted in FIG. 6C may be subtracted from the delay of the signal propagation depicted in FIG. 6B to determine d2clk. This value is d2clk may be utilized as a measurement of set-up/hold time for the particular flip-flop of flip-flops of the flop bank 302 being evaluated. The various modes of operating the control circuit 600 are set by the mode control 410 logic.

In one embodiment the flip-flop setup and hold time is determined from clk2Q and the D to clock delay as follows, where D to clock (d2clk) is the delay between arrival of the signal at the flip flop input and arrival of the clock signal at the flip flop:

$$d2clk \Rightarrow clk2Q = \alpha(clk2Q_{high\_d2clk}) \qquad \text{Equation 2}$$

Here α is a multiplier, e.g., between 1.05 and 1.15. A "high" level of d2clk is a level at which clk2Q is at or close to saturated (e.g., within 0-10%). At saturation any change in d2clk has no effect on clk2Q.

Different values for d2clk are configured and clk2Q is measured (based on ring oscillation frequency) for each configuration. In this manner the d2clk setting that extends clk2Q by a factor of α (e.g., 10%) may be determined and used as the value of the flip-flop setup and hold time.

LISTING OF DRAWING ELEMENTS

- 100 ring oscillator stage
- 102 flip-flop
- 104 inverter
- 200 ring oscillator
- 202 OR gate
- 204 falling CP edge
- 206 rising CP edge
- 300 control circuit
- 302 flop bank
- 304 flip flop
- 306 multiplexer
- 308 inverter
- 310 multiplexer
- 312 multiplexer
- 314 multiplexer
- 316 multiplexer
- 318 AND gate
- 320 OR gate
- 322 AND gate
- 324 delay elements
- 402 data delay
- 404 clock delay
- 406 multiplexer
- 408 multiplexer
- 410 mode control
- 500 delay element
- 502 inverter
- 504 tri-state inverter
- 600 control circuit Various functional operations described herein may be implemented in logic that is referred to using a noun or noun phrase reflecting said operation or function. For example, an association operation may be carried out by an "associator" or "correlator". Likewise, switching may be carried out by a "switch", selection by a "selector", and so on. "Logic" refers to machine memory circuits and non-transitory machine readable media comprising machine-executable instructions (software and firmware), and/or circuitry (hardware) which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter).

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, claims in this application that do not otherwise include the "means for" [performing a function] construct should not be interpreted under 35 U.S.C § 112(f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

As used herein, a recitation of "and/or" with respect to two or more elements should be interpreted to mean only one element, or a combination of elements. For example, "element A, element B, and/or element C" may include only element A, only element B, only element C, element A and element B, element A and element C, element B and element C, or elements A, B, and C. In addition, "at least one of element A or element B" may include at least one of element A, at least one of element B, or at least one of element A and at least one of element B. Further, "at least one of element A and element B" may include at least one of element A, at least one of element B, or at least one of element A and at least one of element B.

The subject matter of the present disclosure is described with specificity herein to meet statutory requirements. However, the description itself is not intended to limit the scope of this disclosure. Rather, the inventors have contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

Having thus described illustrative embodiments in detail, it will be apparent that modifications and variations are possible without departing from the scope of the invention as claimed. The scope of inventive subject matter is not limited to the depicted embodiments but is rather set forth in the following Claims.

What is claimed is:

1. A ring oscillator comprising:
   a plurality of flip-flops configured into a ring;
   logic to selectively invert the output of a first flip-flop in the ring and inject the inverted output as a clock signal to a second flip-flop in the ring; and
   logic to select (a) a clock-to-Q propagation path for the ring oscillator, (b) a Q path calibration path for the ring oscillator, and (c) a nQ (complement of Q) path calibration for the ring oscillator.

2. The ring oscillator of claim 1, further comprising:
   circuits to independently delay the clock signal and a data input signal to the flip-flops.

3. The ring oscillator of claim 2, wherein a delay of the clock signal consists of two independent delay settings.

4. The ring oscillator of claim 2, wherein a delay of the data input signal comprises N>2 independent delay settings.

5. A system comprising:
   a plurality of stages configured into a ring, each comprising a flip-flop;
   logic to selectively invert the output of a first stage in the ring in response to an operational mode setting for the ring, and inject the inverted output as a clock signal to the flip-flop in a second stage in the ring;
   logic to determine a clock-to-Q delay of the flip-flop based on an oscillation frequency of the ring; and
   logic to determine a setup and hold time for the flip flop from the oscillation frequency of the ring.

6. The system of claim 5, further comprising:
   logic to independently delay the clock signal and a data input signal to the flip-flop.

7. The system of claim 6, wherein a delay of the clock signal comprises a binary setting.

8. The system of claim 6, wherein a delay of the data input signal comprises N>2 independent delay settings.

9. A method comprising:
   propagating a clock signal through a plurality of flip-flop stages configured into a ring;
   inverting the output of a first flip-flop in the ring in response to a selectively-applied operating mode signal, and applying the inverted output as the clock signal to a second flip-flop in the ring; and
   determining a setup and hold time for one or more flip-flops of the ring from the oscillation frequency of the ring.

10. The method of claim 9, further comprising:
    determining a clock-to-Q delay of one or more flip-flops of the ring based on an oscillation frequency of the ring.

11. The method of claim 9, further comprising:
    independently delaying the clock signal and a data input signal to one or more flip-flops of the ring.

12. The system of claim 11, wherein a delay of the clock signal comprises a binary setting.

13. The system of claim 11, wherein a delay of the data input signal comprises N>2 independent delay settings.

14. A circuit comprising:
    one or more flip-flops;
    a first configurable delay element to configure a delay of a data signal to the one or more flip-flops;
    a second configurable delay element to configure a delay of a clock signal to the one or more flip-flops;
    logic to determine a clock-to-Q delay of the one or more flip-flops based on operating the circuit in a first propagation mode; and
    logic to determine a setup and hold time for the one or more flip-flops based on the first propagation mode, a first calibration mode, and a second calibration mode.

15. The circuit of claim 14, further comprising:
    logic to apply an output of the one or more flip-flops as the clock signal for one or more other flip-flops.

16. The circuit of claim 14, further comprising:
    logic to invert an output of the one or more flip-flops as the data signal input to the one or more flip-flops upon occurrence of a next clock signal.

* * * * *